United States Patent
Chung et al.

(10) Patent No.: US 8,203,860 B2
(45) Date of Patent: Jun. 19, 2012

(54) SEMICONDUCTOR MEMORY DEVICE HAVING DRIVER FOR COMPENSATING FOR PARASITIC RESISTANCE OF DATA INPUT-OUTPUT PADS

(75) Inventors: Hae-young Chung, Seoul (KR); Yang-ki Kim, Seoul (KR); Seok-woo Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 366 days.

(21) Appl. No.: 12/461,141

(22) Filed: Aug. 3, 2009

(65) Prior Publication Data
US 2010/0110749 A1    May 6, 2010

(30) Foreign Application Priority Data
Nov. 4, 2008   (KR) .................. 10-2008-0109040

(51) Int. Cl.
*G11C 5/06* (2006.01)
*H01S 4/00* (2006.01)
*G11C 8/08* (2006.01)
(52) U.S. Cl. ............... 365/63; 365/230.06; 29/592.1
(58) Field of Classification Search ............ 365/63, 365/230.06; 29/592.1
See application file for complete search history.

(56) References Cited

U.S. PATENT DOCUMENTS
5,568,346 A   10/1996   Orchard-Webb
6,806,582 B2  10/2004   Ahn et al.

FOREIGN PATENT DOCUMENTS
JP   08-046132        2/1996
KR   10-2002-0061872 A  7/2002
KR   10-2004-0066306 A  7/2004
KR   10-2005-0035650 A  4/2005

OTHER PUBLICATIONS

I/O Pads, ECN 5263 Digital VLSI Design, Oklahoma State Univerisity, Sep. 19, 2005, pp. 1-5.*
Neil H. E. Weste and David Harris, CMOS VLSI Design, Third Edition, Addison-Wesley Publisher 2005.*

* cited by examiner

*Primary Examiner* — Alexander Sofocleous
*Assistant Examiner* — Hai Pham
(74) *Attorney, Agent, or Firm* — Lee & Morse, P.C.

(57) ABSTRACT

A semiconductor memory device that includes a supply voltage pad, a ground voltage pad, and at least two data input/output pads arranged between the supply voltage pad and the ground voltage pad. The semiconductor memory device has a first pull-up driver that is connected to the second data input/output pad located at a first distance from the supply voltage pad, and a first pull-down driver that is connected to the first data input/output pad located at a second distance from the ground voltage pad.

20 Claims, 3 Drawing Sheets

SEMICONDUCTOR MEMORY DEVICE HAVING DRIVER FOR COMPENSATING FOR PARASITIC RESISTANCE OF DATA INPUT-OUTPUT PADS

BACKGROUND

1. Field of Endeavor

Embodiments relate to a semiconductor memory device, and more particularly, to a semiconductor memory device having a driver for compensating for a parasitic resistance of data input/output pads that share a supply voltage pad and a ground voltage pad.

2. Description of the Related Art

In a semiconductor memory device, a plurality of data input/output pads DQs are present at the end of a data path in which memory cell data is read or written. The data input/output pads DQs are connected to a driver for outputting the read memory cell data. The driver has a structure in which a pull-up transistor is connected between a supply voltage pad VDDQ and each of the data input/output pads DQ. Furthermore, a pull-down transistor is connected between a ground voltage pad VSSQ and each of the data input/output pads DQ. The pull-up transistor and the pull-down transistor are turned on or off according to internal data signals generated in relation to the read memory cell data.

In each of the data input/output pads DQ, the supply voltage pad VDDQ and the ground voltage pad VSSQ, that respectively apply a supply voltage and a ground voltage to the driver, are located at both sides of the data input/output pad DQ. That is, one supply voltage pad VDDQ and one ground voltage pad VSSQ are installed for each data input/output pad DQ.

SUMMARY

Embodiments are directed to a semiconductor memory device having a driver for compensating for a parasitic resistance of data input/output pads that share a supply voltage pad and a ground voltage pad, which substantially overcome one or more of the problems due to the limitations and disadvantages of the related art.

It is another feature of an exemplary embodiment to provide a method of forming a semiconductor memory device that compensates for parasitic resistance of the data input/output pads that share the supply voltage pad and the ground voltage pad.

At least one of the above and other features and advantages may be realized by providing a semiconductor memory device that includes a supply voltage pad, a ground voltage pad, and at least two data input/output pads arranged between the supply voltage pad and the ground voltage pad. A first pull-up driver may be arranged connected to the second data input/output pad located at a first distance from the supply voltage pad, and a first pull-down driver may be arranged connected to the first data input/output pad located at a second distance from the ground voltage pad.

The first pull-up driver may include a resistor, a first end of which is connected to the supply voltage pad, a first pull-up transistor having a source connected to a second end of the resistor, a gate to which a first internal data signal of the semiconductor memory device is supplied, a drain connected to the second data input/output pad, and a second pull-up transistor having a source connected to the second end of the resistor, a gate to which the first internal data signal of the semiconductor memory device is supplied, and a drain connected to the second data input/output pad. The resistor may be a parasitic resistance caused by a first distance between the supply voltage pad and the second data input/output pad.

The first pull-down driver may include a first pull-down transistor having a drain connected to the first data input/output pad and a gate to which a second internal data signal of the semiconductor memory device is supplied, a resistor connected between a source of the first pull-down transistor and the ground voltage pad. The first pull-down driver may also include a second pull-down transistor having a drain connected to the first data input/output pad, a gate to which the second internal data signal of the semiconductor memory device is supplied, and a source connected to the source of the first pull-down transistor, wherein the second pull-down transistor is connected in parallel to the first pull-down transistor. The resistor may be a parasitic resistance caused by a physical distance between the ground voltage pad and the first data input/output pad.

The semiconductor memory device may further include a second pull-down driver connected to the second data input/output pad. The second pull-down driver may include a pull-down transistor having a drain connected to the second data input/output pad and a gate to which a second internal data signal of the semiconductor memory device is supplied, and a resistor connected between the source of the pull-down transistor and the ground voltage pad. The resistor may be a parasitic resistance caused by a physical distance between the second data input/output pad and the ground voltage pad.

The semiconductor memory device may further include a second pull-up driver connected to the first data input/output pad. The second pull-up driver may include a resistor, a first end of which is connected to the supply voltage pad, a pull-up transistor having a source connected to a second end of the resistor, a gate to which a first internal data signal of the semiconductor memory device is supplied, and a drain connected to the first data input/output pad. The resistor may be a parasitic resistance caused by a physical distance between the supply voltage pad and the first data input/output pad.

At least one of the above and other features and advantages may also be realized by providing a method of forming a semiconductor memory device that includes forming a supply voltage pad, forming a ground voltage pad, and forming at least two data input/output pads arranged between the supply voltage pad and the ground voltage pad. A first pull-up driver may be arranged connected to the second data input/output pad located at a first distance from the supply voltage pad, and a first pull-down driver may be arranged connected to the first data input/output pad located at a second distance from the ground voltage pad.

The method of forming the first pull-up driver may include forming a resistor, a first end of which is connected to the supply voltage pad, forming a first pull-up transistor having a source connected to a second end of the resistor, a gate to which a first internal data signal of the semiconductor memory device is supplied, and a drain connected to the second data input/output pad, and forming a second pull-up transistor having a source connected to the second end of the resistor, a gate to which the first internal data signal of the semiconductor memory device is supplied, and a drain connected to the second data input/output pad. The second pull-up transistor may be connected in parallel to the first pull-up transistor. The resistor may be a parasitic resistance caused by the first distance between the supply voltage pad and the second data input/output pad.

The method of forming the first pull-down driver may include forming a first pull-down transistor having a drain connected to the first data input/output pad and a gate to which a second internal data signal of the semiconductor memory device is supplied, forming a resistor connected between a source of the first pull-down transistor and the ground voltage pad. The method of forming the first pull-down driver may also include forming a second pull-down transistor having a drain connected to the first data input/output pad, a gate to which the second internal data signal of the semiconductor memory device is supplied, and a source connected to the source of the first pull-down transistor. The second pull-down transistor may be connected in parallel to the first pull-down transistor. The resistor may be a parasitic resistance caused by the second distance between the ground voltage pad and the first data input/output pad.

The method of forming the semiconductor memory device may include forming a second pull-down driver connected to the second data input/output pad. Forming the second pull-down driver may include forming a pull-down transistor having a drain connected to the second data input/output pad and a gate to which a second internal data signal of the semiconductor memory device is supplied, and forming a resistor connected between the source of the pull-down transistor and the ground voltage pad. The resistor may be a parasitic resistance caused by a physical distance between the second data input/output pad and the ground voltage pad.

The method of forming the semiconductor memory device may further include forming a second pull-up driver connected to the first data input/output pad. Forming the second pull-up driver may include forming a resistor, a first end of which is connected to the supply voltage pad, and forming a pull-up transistor having a source connected to a second end of the resistor, a gate to which a first internal data signal of the semiconductor memory device is supplied, and a drain connected to the first data input/output pad. The resistor may be a parasitic resistance caused by a physical distance between the supply voltage pad and the first data input/output pad.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2008-0109040, filed on Nov. 4, 2008, in the Korean Intellectual Property Office, and entitled: "Semiconductor Memory Device Having Driver for Compensating for Parasitic Resistance of Data Input/Output Pads," is incorporated by reference herein in its entirety.

Example embodiments will now be described more fully hereinafter with reference to the accompanying drawings; however, they may be embodied in different forms and should not be construed as limited to the embodiments set forth herein. Rather, these exemplary embodiments are provided so that this disclosure will be thorough and complete, and will fully convey the scope of the invention to those skilled in the art.

It will be understood that when an element or layer is referred to as being "on," "connected to," or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

Figure 1:
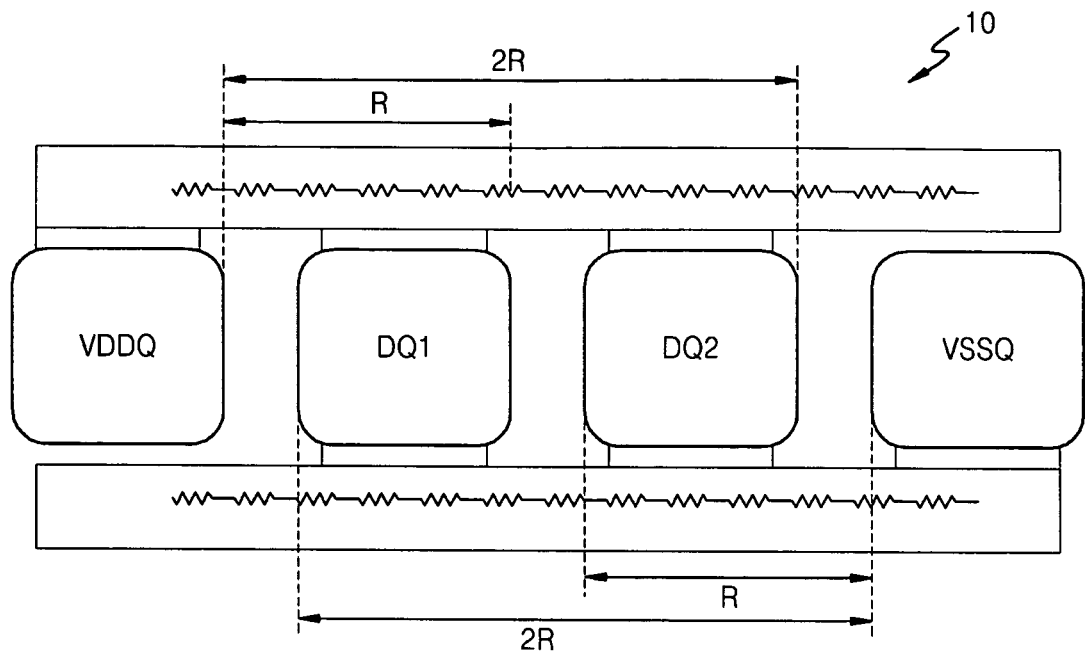
FIG. 1 illustrates a semiconductor memory device in which two data input/output pads are arranged between a supply voltage pad and a ground voltage pad, according to an exemplary embodiment.

Referring to FIG. 1, according to an exemplary embodiment, a semiconductor memory device 10 may have two data input/output pads that are arranged between a supply voltage pad and a ground voltage pad. In the semiconductor memory device 10, first and second data input/output pads DQ1 and DQ2 may be arranged between a supply voltage pad VDDQ and a ground voltage pad VSSQ. In this arrangement, a physical distance between the data input/output pads DQs and the supply voltage pad VDDQ, and a physical distance between the data input/output pads DQs and the ground voltage pad VSSQ, are different from one another. Thus, a parasitic voltage drop occurs between the supply voltage pad VDDQ and the data input/output pads DQs, and between the data input/output pads DQs and the ground voltage pad VSSQ. The parasitic voltage drop may cause degradation of the driving performance of the driver and a reduction in the switching speeds.

If a metal line resistance caused due to a physical distance between the supply voltage pad VDDQ and the first data input/output pad DQ1 is R', a metal line resistance caused due to a physical distance between the supply voltage pad VDDQ and the second data input/output pad DQ2 may be about 2R'. Likewise, if the metal line resistance caused due to the physical distance between the ground voltage pad VSSQ and the second data input/output pad DQ2 is R', the metal line resistance caused due to the physical distance between the ground voltage pad VSSQ and the first data input/output pad DQ1 may be about 2R'.

Figure 2A:
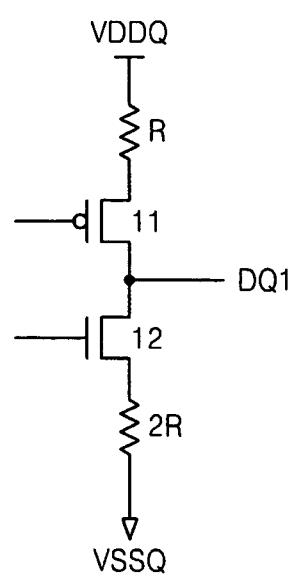
FIGS. 2A and 2B illustrate equivalent circuit models of a driver connected to first and second data input/output pads that are arranged as illustrated in FIG. 1.
Figure 2B:
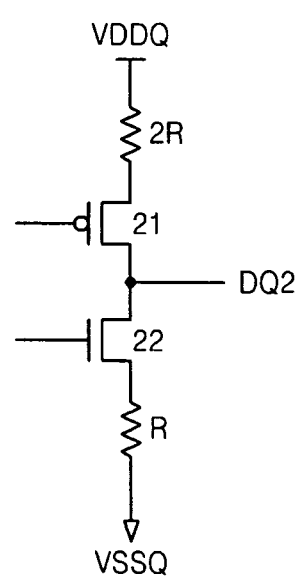

A driver connected to the first and second data input/output pads DQ1 and DQ2, arranged as illustrated in FIG. 1, may have a circuit diagram model as illustrated in FIGS. 2A and 2B. Referring to FIG. 2A, a first pull-up transistor 11 connected to the first data input/output pad DQ1 may be connected to the supply voltage pad VDDQ via a first parasitic resistor R, having a resistance of R'. Furthermore, a first pull-down transistor 12 may be connected to the ground voltage pad VSSQ via a second parasitic resistor 2R, having a resistance of 2R'. Thus, an on-resistance value $R_{on}$ of the first pull-up transistor 11 could be different from an on-resistance value $R_{on}$ of the first pull-down transistor 12.

Referring to FIG. 2B, a second pull-up transistor 21 connected to the second data input/output pad DQ2 may be connected to the supply voltage pad VDDQ via a third parasitic resistor 2R, having a resistance of 2R'. Furthermore, a second pull-down transistor 22 may be connected to the ground voltage pad VSSQ via a fourth parasitic resistor R, having a resistance of R'. Thus, an on-resistance value $R_{on}$ of the second pull-up transistor 21 could be different from an on-resistance value $R_{on}$ of the second pull-down transistor 22.

In order to operate the semiconductor memory 10 device at a higher speed, a plurality of pieces of data that are to be transmitted to the data input/output pads DQ1 and DQ2 may need to be switched with small voltage swing. This may be preferable because a signal recognition level changes in an interface between a central processing unit (CPU) and the semiconductor memory device 10. However, since the on-resistance value of the first and second pull-up and pull-down transistors 11, 12, 21, and 22, illustrated in FIGS. 2A and 2B, are different from one another, the driving performances of the first and second pull-up and pull-down transistors 11, 12, 21, and 22 may be different from one another. Accordingly, the speeds at which the pieces of the data are switched may not be the same, which may directly influence the operating speed of the semiconductor memory device 10.

Figure 3:
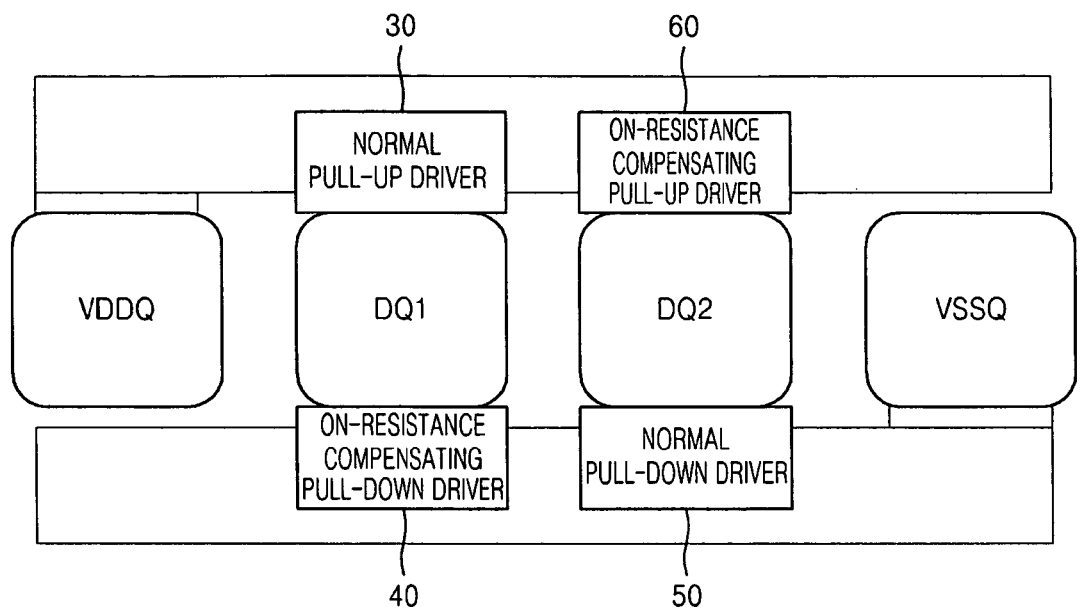
FIG. 3 illustrates a block diagram of a semiconductor memory device according to an exemplary embodiment.

To address the difference in on-resistance values, when the semiconductor memory device 10 may be formed with the first data input/output pad DQ1 located near to the supply voltage pad VDDQ and at a distance from the ground voltage pad VSSQ, the first data input/output pad DQ1 may be connected to a normal pull-up driver 30 and an on-resistance compensating pull-down driver 40, as shown in FIG. 3. Moreover, when the second data input/output pad DQ2 is located near to the ground voltage pad VSSQ and at a distance from the supply voltage pad VDDQ, the second data input/output pad DQ2 may be connected to a normal pull-down driver 50 and an on-resistance compensating pull-up driver 60. An exemplary embodiment of this configuration is shown in FIG. 3.

Figure 4:
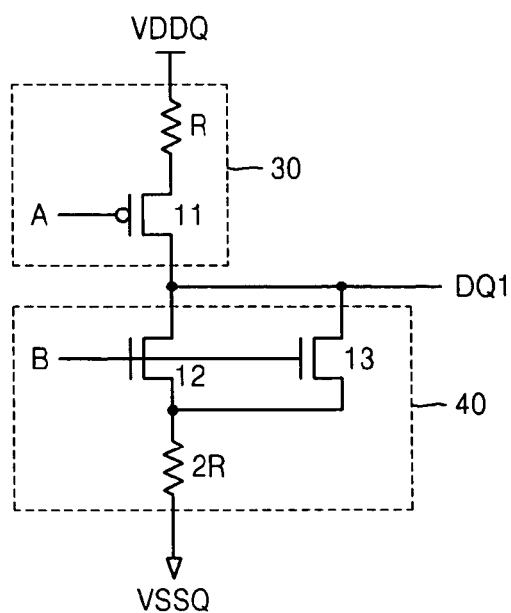
FIGS. 4 and 5 illustrate circuit diagrams of drivers connected to first and second data input/output pads of FIG. 3.
Figure 5:
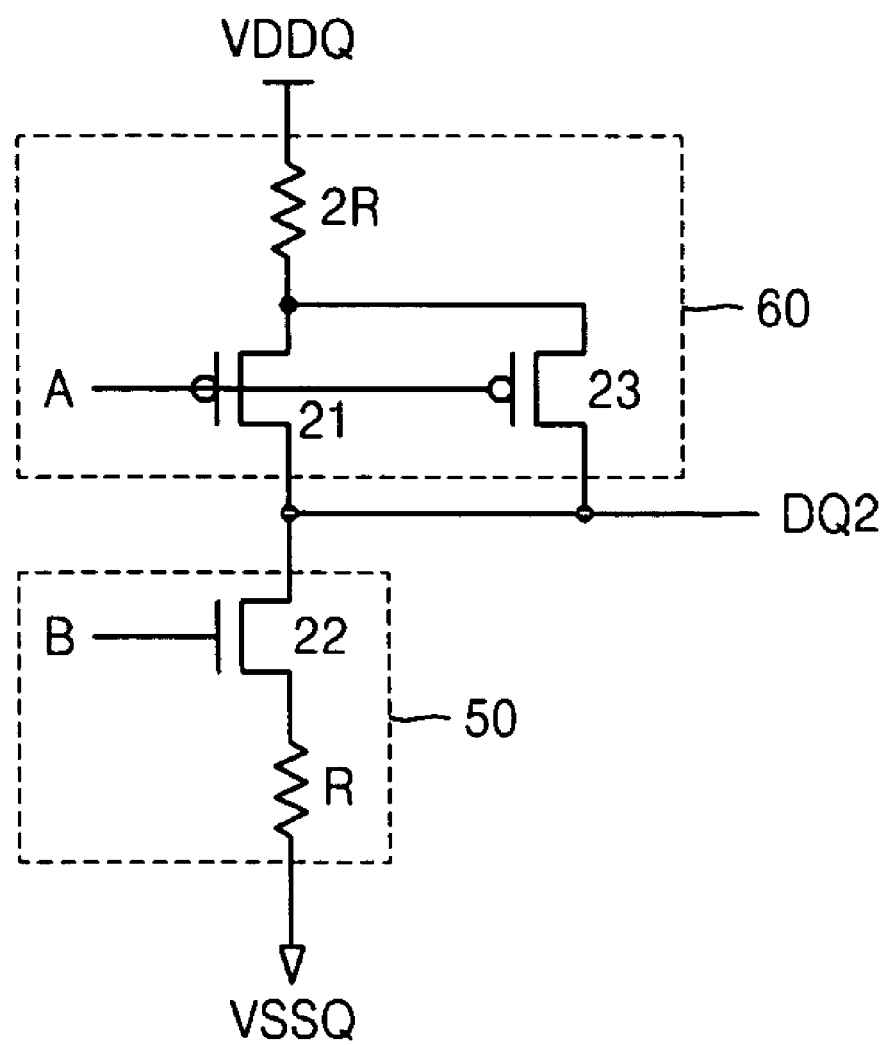

FIGS. 4 and 5 illustrate circuit diagrams of drivers connected to first and second data input/output pads DQ1 and DQ2, according to an exemplary embodiment. Referring to FIG. 4, the semiconductor memory device 10 may have a normal pull-up driver 30 that is connected to the first data input/output pad DQ1 and includes the first parasitic resistor R and the first pull-up transistor 11. The first pull-up transistor 11 may be connected between the supply voltage pad VDDQ and the first data input/output pad DQ1. The semiconductor memory device 10 may also have the on-resistance compensating pull-down driver 40 that includes the first pull-down transistor 12 and the second parasitic resistor 2R, which are connected in series between the first data input/output pad DQ1 and the ground voltage pad VSSQ. The on-resistance compensating pull-down driver 40 also may include the second pull-down transistor 13 that is connected in parallel to the first pull-down transistor 12. A gate of the second pull-down transistor 13 may also be connected to a gate of the first pull-down transistor 12.

Referring to FIG. 4, the semiconductor memory device 10 may have the pull-up transistor 11 and the pull-down transistors 12 and 13 being controlled by supplying internal data signals A and B, which may be generated in relation to read memory cell data, to gates of the pull-up and pull-down transistors. When the first and second pull-down transistors 12 and 13, which are preferably connected in parallel, are turned on, the on-resistance compensating pull-down driver 40 compensates for on-resistance values of the first and second pull-down transistors 12 and 13, so that these values may be less than the resistance value of the second parasitic resistor 2R.

Referring to FIG. 5, the semiconductor memory device 10 may have the on-resistance compensating pull-up driver 60 connected to the second data input/output pad DQ2 that includes the first parasitic resistor 2R and the first pull-up transistor 21, which are preferably connected in series between the supply voltage pad VDDQ and the second data input/output pad DQ2. The on-resistance compensating pull-up driver 60 also may include a second pull-up transistor 23 that is preferably connected in parallel to the first pull-up transistor 21. The normal pull-down driver 50 may include the first pull-down transistor 22 and the second parasitic resistor R connected between the second data input/output pad DQ2 and the ground voltage pad VSSQ. A gate of the second pull-up transistor 23 may be connected to a gate of the first pull-up transistor 21.

Referring to FIG. 5, the semiconductor memory device 10 may have the pull-up transistors 21 and 23, and pull-down transistor 22, being controlled by supplying internal data signals A and B, which may be generated in relation to read memory cell data, to gates of the pull-up and pull-down transistors. When the first and second pull-up transistors 21 and 23, which are preferably connected in parallel, are turned on, the compensating pull-up driver 60 compensates for on-resistance values of the first and second pull-up transistors 21 and 23 so that these values may be less than a resistance value of the first parasitic resistor 2R.

Accordingly, the on-resistance compensating pull-up/pull-down drivers 40 and 60, according to the current exemplary embodiment, may be capable of compensating for parasitic resistance of a plurality of data input/output pads that share a supply voltage pad and a ground voltage pad. Therefore, the current, exemplary embodiment may improve the driving performance and switching speeds of the semiconductor memory device.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. A semiconductor memory device, comprising:
   a supply voltage pad;
   a ground voltage pad;
   at least two data input/output pads arranged between the supply voltage pad and the ground voltage pad;
   a first pull-up driver and a first pull-down driver both connected to a first data input/output pad of the at least two data input/output pads; and
   a second pull-down driver and a second pull-up driver both connected to a second data input/output pad of the at least two data input/output pads, wherein:
   the first pull-up driver and the first pull-down driver are between the supply voltage pad and the ground voltage pad, respectively, and the first data input/output pad, a number of transistors in the first pull-up driver is less than a number of transistors in the first pull-down driver, and the first data input/output pad is closer to the supply voltage pad than the ground voltage pad, and
   the second pull-down driver and the second pull-up driver are between ground voltage pad and the supply voltage pad, respectively, and the second data input/output pad, a number of transistors in the second pull-down driver is less than a number of transistors in the second pull-up driver, and the second data input/output pad is closer to the ground voltage pad than the supply voltage pad.

2. The semiconductor memory device as claimed in claim 1, wherein:
   the first pull-up driver includes a first pull-up transistor between the first data input/output pad and the supply voltage pad, and the first pull-down driver includes a first pull-down transistor connected in parallel to a second pull-down transistor, the first and second pull-down transistors being arranged in parallel between the first data input/output pad and the ground voltage pad, and the second pull-down driver includes a third pull-down transistor between the second data input/output pad and the ground voltage pad, and the second pull-up driver includes a second pull-up transistor connected in parallel to a third pull-up transistor, the first and second pull-up transistors being arranged in parallel between the second data input/output pad and the supply voltage pad.

3. The semiconductor memory device as claimed in claim 2, wherein the second pull-up driver includes:
  a resistor, a first end of which is connected to the supply voltage pad;
  the second pull-up transistor having a source connected to a second end of the resistor, a gate to which a first internal data signal of the semiconductor memory device is supplied, and a drain connected to the second data input/output pad; and
  the third pull-up transistor having a source connected to the second end of the resistor, a gate to which the first internal data signal of the semiconductor memory device is supplied, and a drain connected to the second data input/output pad.

4. The semiconductor memory device as claimed in claim 3, wherein the resistor is a parasitic resistance caused by a distance between the supply voltage pad and the second data input/output pad.

5. The semiconductor memory device as claimed in claim 3, wherein the first pull-down driver includes:
  the first pull-down transistor having a drain connected to the first data input/output pad and a gate to which a second internal data signal of the semiconductor memory device is supplied;
  a resistor connected between a source of the first pull-down transistor and the ground voltage pad; and
  the second pull-down transistor having a drain connected to the first data input/output pad, a gate to which the second internal data signal of the semiconductor memory device is supplied, and a source connected to the source of the first pull-down transistor.

6. The semiconductor memory device as claimed in claim 5, wherein the resistor is a parasitic resistance caused by a distance between the ground voltage pad and the first data input/output pad.

7. The semiconductor memory device as claimed in claim 3, wherein the second pull-down driver includes:
  the third pull-down transistor having a drain connected to the second data input/output pad and a gate to which a second internal data signal of the semiconductor memory device is supplied; and
  a resistor connected between the source of the third pull-down transistor and the ground voltage pad.

8. The semiconductor memory device as claimed in claim 7, wherein the resistor is a parasitic resistance caused by a physical distance between the second data input/output pad and the ground voltage pad.

9. The semiconductor memory device as claimed in claim 5, wherein the first pull-up driver includes:
  a resistor, a first end of which is connected to the supply voltage pad; and
  the first pull-up transistor having a source connected to a second end of the resistor, a gate to which a first internal data signal of the semiconductor memory device is supplied, and a drain connected to the first data input/output pad.

10. The semiconductor memory device as claimed in claim 9, wherein the resistor is a parasitic resistance caused by a physical distance between the supply voltage pad and the first data input/output pad.

11. A method of forming a semiconductor memory device, comprising:
  forming a supply voltage pad;
  forming a ground voltage pad;
  forming at least two data input/output pads arranged between the supply voltage pad and the ground voltage pad;
  forming a first pull-up driver and a first pull-down driver both connected to a first data input/output pad of the at least two data input/output pads; and
  forming a second pull-down driver and a second pull-up driver both connected to a second data input/output pad of the at least two data input/output pads, wherein:
  the first pull-up driver and the first pull-down driver are formed between the supply voltage pad and the ground voltage pad, respectively, and the first data input/output pad, a number of transistors in the first pull-up driver is less than a number of transistors in the first pull-down driver, and the first data input/output pad is formed closer to the supply voltage pad than the ground voltage pad, and
  the second pull-down driver and the second pull-up driver are formed between ground voltage pad and the supply voltage pad, respectively, and the second data input/output pad, a number of transistors in the second pull-down driver is less than a number of transistors in the second pull-up driver, and the second data input/output pad is formed closer to the ground voltage pad than the supply voltage pad.

12. The method of forming the semiconductor memory device as claimed in claim 11, wherein:
  the first pull-up driver includes a first pull-up transistor between the first data input/output pad and the supply voltage pad, and the first pull-down driver includes a first pull-down transistor connected in parallel to a second pull-down transistor, the first and second pull-down transistors being arranged in parallel between the first data input/output pad and the ground voltage pad, and
  the second pull-down driver includes a third pull-down transistor between the second data input/output pad and the ground voltage pad, and the second pull-up driver includes a second pull-up transistor connected in parallel to a third pull-up transistor, the first and second pull-up transistors being arranged in parallel between the second data input/output pad and the supply voltage pad.

13. The method of forming a semiconductor memory device as claimed in claim 12, wherein forming the second pull-up driver includes:
  forming a resistor, a first end of which is connected to the supply voltage pad;
  forming the second pull-up transistor having a source connected to a second end of the resistor, a gate to which a first internal data signal of the semiconductor memory device is supplied, and a drain connected to the second data input/output pad; and
  forming the third pull-up transistor having a source connected to the second end of the resistor, a gate to which the first internal data signal of the semiconductor memory device is supplied, and a drain connected to the second data input/output pad.

14. The method of forming the semiconductor memory device as claimed in claim 13, wherein the resistor is a parasitic resistance caused by a distance between the supply voltage pad and the second data input/output pad.

15. The method of forming the semiconductor memory device as claimed in claim 13, wherein forming the first pull-down driver includes:
   forming the first pull-down transistor having a drain connected to the first data input/output pad and a gate to which a second internal data signal of the semiconductor memory device is supplied;
   forming a resistor connected between a source of the first pull-down transistor and the ground voltage pad; and
   forming the second pull-down transistor having a drain connected to the first data input/output pad, a gate to which the second internal data signal of the semiconductor memory device is supplied, and a source connected to the source of the first pull-down transistor.

16. The method of forming the semiconductor memory device as claimed in claim 15, wherein the resistor is a parasitic resistance caused by a distance between the ground voltage pad and the first data input/output pad.

17. The method of forming the semiconductor memory device as claimed in claim 13,
   wherein forming the second pull-down driver includes:
   forming the third pull-down transistor having a drain connected to the second data input/output pad and a gate to which a second internal data signal of the semiconductor memory device is supplied; and
   forming a resistor connected between the source of the third pull-down transistor and the ground voltage pad.

18. The method of forming the semiconductor memory device as claimed in claim 17, wherein the resistor is a parasitic resistance caused by a physical distance between the second data input/output pad and the ground voltage pad.

19. The method of forming the semiconductor memory device as claimed in claim 15,
   wherein forming the second first pull-up driver includes:
   forming a resistor, a first end of which is connected to the supply voltage pad; and
   forming the first pull-up transistor having a source connected to a second end of the resistor, a gate to which a first internal data signal of the semiconductor memory device is supplied, and a drain connected to the first data input/output pad.

20. The method of forming the semiconductor memory device as claimed in claim 19, wherein the resistor is a parasitic resistance caused by a physical distance between the supply voltage pad and the first data input/output pad.

* * * * *